(12) United States Patent
Miyoshi

(10) Patent No.: US 8,125,778 B2
(45) Date of Patent: Feb. 28, 2012

(54) DEVICE FOR AIR-COOLING ELECTRONIC APPARATUS

(75) Inventor: Toyokazu Miyoshi, Kanagawa (JP)

(73) Assignee: Kabushiki Kaisha Kenwood, Hachiouji-shi, Tokyo (JP)

( * ) Notice: Subject to any disclaimer, the term of this patent is extended or adjusted under 35 U.S.C. 154(b) by 260 days.

(21) Appl. No.: 11/920,694

(22) PCT Filed: May 22, 2006

(86) PCT No.: PCT/JP2006/310601
§ 371 (c)(1),
(2), (4) Date: Nov. 19, 2007

(87) PCT Pub. No.: WO2006/126693
PCT Pub. Date: Nov. 30, 2006

(65) Prior Publication Data
US 2009/0168346 A1    Jul. 2, 2009

(30) Foreign Application Priority Data

May 24, 2005  (JP) ................................. 2005-150496

(51) Int. Cl.
*H05K 7/20*  (2006.01)
(52) U.S. Cl. ........ 361/695; 361/690; 361/692; 361/694; 361/679.49; 361/679.51
(58) Field of Classification Search .................. 361/695, 361/690, 692, 694
See application file for complete search history.

(56) References Cited

U.S. PATENT DOCUMENTS

| | | | | |
|---|---|---|---|---|
| 2,824,939 A | * | 2/1958 | Claybourn et al. | 200/289 |
| 3,967,874 A | * | 7/1976 | Calabro | 361/695 |
| 4,479,198 A | * | 10/1984 | Romano et al. | 361/679.33 |
| 4,502,100 A | * | 2/1985 | Greenspan et al. | 361/695 |
| 4,699,208 A | * | 10/1987 | Wolf et al. | 165/47 |
| 4,894,749 A | * | 1/1990 | Elko et al. | 361/690 |
| 5,103,374 A | * | 4/1992 | Azar | 361/689 |

(Continued)

FOREIGN PATENT DOCUMENTS
JP     60-033744     2/1985
(Continued)

OTHER PUBLICATIONS
International Search Report (Application No. PCT/JP2006/310601).
(Continued)

*Primary Examiner* — Anatoly Vortman
(74) *Attorney, Agent, or Firm* — Eric J. Robinson; Robinson Intellectual Property Law Office, P.C.

(57) ABSTRACT

A device for air-cooling an electronic apparatus, where a suction opening (4) is provided in a housing (1), discharge openings (5) are provided in housings (1, 2), an airflow passing the inside of the housings is generated by a fan (6), and heat produced by a heart-producing body (9) is released to the outside of the housings by the airflow. Air introduction plates inclined to change the direction of the airflow are arranged at the suction opening (4), and a large number of projections are formed on the surfaces of the air introduction plates. The device for air-cooling an electronic apparatus has increased capacity for cooling a heat-producing part without increase in the size of the device, and in the device, accumulation of dust on the heat-producing part can be prevented.

16 Claims, 6 Drawing Sheets

U.S. PATENT DOCUMENTS

| | | | | |
|---|---|---|---|---|
| 5,563,768 | A | * | 10/1996 | Perdue ............................ 361/695 |
| 5,597,035 | A | * | 1/1997 | Smith et al. .................... 165/80.3 |
| 5,689,403 | A | | 11/1997 | Robertson, Jr. et al. |
| 5,704,212 | A | * | 1/1998 | Erler et al. ........................ 62/3.2 |
| 5,940,266 | A | * | 8/1999 | Hamilton et al. .............. 361/695 |
| 5,963,424 | A | * | 10/1999 | Hileman et al. ............... 361/695 |
| 5,983,890 | A | * | 11/1999 | Thomas et al. ................. 126/512 |
| 6,643,130 | B1 | | 11/2003 | DeMarchis et al. |
| 7,038,911 | B2 | * | 5/2006 | Foster et al. .................... 361/695 |
| 7,180,740 | B2 | * | 2/2007 | Li et al. ........................... 361/697 |
| 7,355,856 | B2 | * | 4/2008 | Petroski ........................... 361/710 |
| 7,447,021 | B2 | * | 11/2008 | Chen ................................ 361/695 |
| 2002/0054479 | A1 | * | 5/2002 | Wu .................................. 361/695 |
| 2002/0159232 | A1 | * | 10/2002 | Beitelmal et al. ............... 361/695 |
| 2003/0168208 | A1 | * | 9/2003 | Sato ................................. 165/122 |
| 2004/0100773 | A1 | * | 5/2004 | Hoffman et al. ................ 361/719 |
| 2004/0196631 | A1 | * | 10/2004 | Ueda et al. ...................... 361/695 |
| 2004/0200608 | A1 | * | 10/2004 | Baldassarre .................... 165/181 |
| 2006/0120043 | A1 | * | 6/2006 | Wolford et al. ................. 361/695 |
| 2006/0172685 | A1 | * | 8/2006 | O'Brien ........................... 454/184 |
| 2007/0097604 | A1 | * | 5/2007 | Bruski et al. .................... 361/605 |

FOREIGN PATENT DOCUMENTS

| | | |
|---|---|---|
| JP | 60-156808 | 10/1985 |
| JP | 06-152170 | 5/1994 |
| JP | 07-055312 | 3/1995 |
| JP | 08-071347 | 3/1996 |
| JP | 2000-105524 | 4/2000 |
| JP | 2003-017882 | 1/2003 |

OTHER PUBLICATIONS

International Preliminary Examination Report (Application No. PCT/JP2006/310601) dated Mar. 27, 2008.

European Search Report (Application No. 06766408.6) dated Oct. 1, 2010.

\* cited by examiner

DEVICE FOR AIR-COOLING ELECTRONIC APPARATUS

TECHNICAL FIELD

The present invention relates to an electronic apparatus, and more particularly to an air-cooling device for the same.

BACKGROUND ART

An exemplary conventional device for air-cooling an electronic apparatus will be described with reference to FIG. 5. An upper housing 1 and a lower housing 2 illustrated in FIG. 5 are coupled to sandwich a chassis 3 and constitutes a housing that contains an electronic apparatus. Suction openings 4, 4 are provided in each of the upper housing 1 and the lower housing 2; and a discharge opening 5 is provided in the chassis 3, or the upper housing 1 and the lower housing 2. A fan 6 is secured to the chassis 3.

Further, bosses 3a, 3a, . . . and radiation fins 3b, 3b, . . . are formed in the chassis 3; and printed boards 8, 8, . . . are fastened to the bosses 3a, 3a, . . . . Heat produced by a maximum-heat-producing part 9 mounted on the printed boards 8, 8, . . . is transmitted via the heat transmitting parts to the chassis 3.

Airflow indicated by the arrow, traveling from the suction openings 4, 4 to the discharge opening 5 is generated by the fan 6. This airflow cools down the chassis 3 and heat-producing electronic parts including the maximum-heat-producing part 9 mounted on the printed boards 8, 8 . . . .

According to the conventional device for air-cooling an electronic apparatus illustrated in FIG. 5, air flows via the suction opening into the inside of the housing and circulates in the inside of the housing. Along with air, dust also enters the inside of the housing, so that dust accumulates in the printed boards 8, 8, . . . and the like. Accordingly, maintenance must be regularly performed to remove the dust. If no maintenance is performed, dust causes the parts in the inside of the housing to be short-circuited, thus causing a failure.

In order to prevent dust from entering the inside of the housing, a dustproof filter may be installed in the suction openings 4, 4 of the air-cooling device illustrated in FIG. 5. However, such an air-cooling device is not suitable for a model having a large amount of heat production because clogging of the filter reduces air-intake to lower the capacity for cooling.

FIG. 6 illustrates an exemplary conventional device for air-cooling an electronic apparatus which allows for dustproof performance. In this example, an upper housing 1 and a lower housing 2 are mounted in the upper and lower parts of a chassis 3, respectively, so that an upper-side space and a lower-side space are formed. Printed boards 8, 8 arranged in the upper-side sealed space are fastened to bosses 3a, 3a, . . . of the chassis 3. Heat produced by a maximum-heat-producing part 9 mounted on the printed boards 8, 8, . . . is transmitted via the heat transmitting parts to the chassis 3.

Suction opening 4 and discharge openings 5, 5 are arranged in the lower housing 2. Airflow indicated by the arrow, traveling from the suction openings 4 to the discharge openings 5, 5 is generated by the fan 6 secured to the upper side of the suction opening 4. This airflow cools down radiation fins 3b, 3b, . . . of the chassis 3. The air in a space where the printed boards 8, 8 are contained is cooled via the chassis 3, and this air cools down electronic parts mounted on the printed boards 8, 8.

According to the conventional device for air-cooling an electronic apparatus illustrated in FIG. 6, accumulation of dust on the printed boards 8, 8 can be prevented. In this structure, however, stationary air surrounding the printed boards 8, 8 are cooled via the chassis 3, so sufficient capacity for cooling is not obtained; the temperature of air surrounding the printed boards 8, 8 rises to raise the temperature of electronic parts mounted on the printed boards 8, 8 thus shortening the life of the electronic parts.

In order to raise the capacity for cooling of the device for air-cooling an electronic apparatus illustrated in FIG. 6, the volume of the chassis 3 acting as a heat radiator and the volume of the sealed space must be increased, thus increasing the size of the electronic apparatus. In this case, improvement can be made by increasing the volume of air sent by the fan. In either case, however, the device is disadvantageous in space saving and manufacturing cost.

For example, a heat-releasing structure for an apparatus described in paragraphs [0013] to [0027], and illustrated in FIGS. 1 to 9 of Japanese Patent Application Laid-Open No. 2002-353677 satisfies the temperature conditions of a heat-producing body irrespective of whether the structure has a horizontal position or a vertical position, but includes no specific means for raising the dustproof performance and the capacity for cooling.

The present invention has been achieved in view of the above problems and has an object to provide a device for air-cooling an electronic apparatus which has increased capacity for cooling a heat-producing part without increase in the size of the device, and in the device, accumulation of dust on the heat-producing part can be prevented.

DISCLOSURE OF THE INVENTION

According to the present invention, there is provided a device for air-cooling an electronic apparatus in which a suction opening is provided in a housing, a discharge opening is provided in the housing, an airflow passing the inside of the housing is generated by a fan, and heat produced by a heat-producing body is released to the outside of the housing by the airflow, a plurality of air introduction plates inclined to change the direction of the airflow being arranged at the suction opening, a large number of projections being formed on the surfaces of the air introduction plates.

In the device for air-cooling an electronic apparatus, the large number of projections has a convex-like shape extending in a direction perpendicular to the airflow.

In the device for air-cooling an electronic apparatus, a plurality of air lead-through boards inclined in a direction different from the air introduction plate are arranged at a down stream region of the air introduction plate.

In the device for air-cooling an electronic apparatus, there is used a dust removing unit in which the plurality of air introduction plates and the plurality of air lead-through boards are formed in an integrated manner, and which can be easily attached or detached to the housing.

According to the inventive device for air-cooling an electronic apparatus, increased capacity for cooling a heat-producing part is obtained without increase in the size of the device, and accumulation of dust on the heat-producing part can be prevented.

BEST MODES FOR CARRYING OUT THE INVENTION

Figure 1:
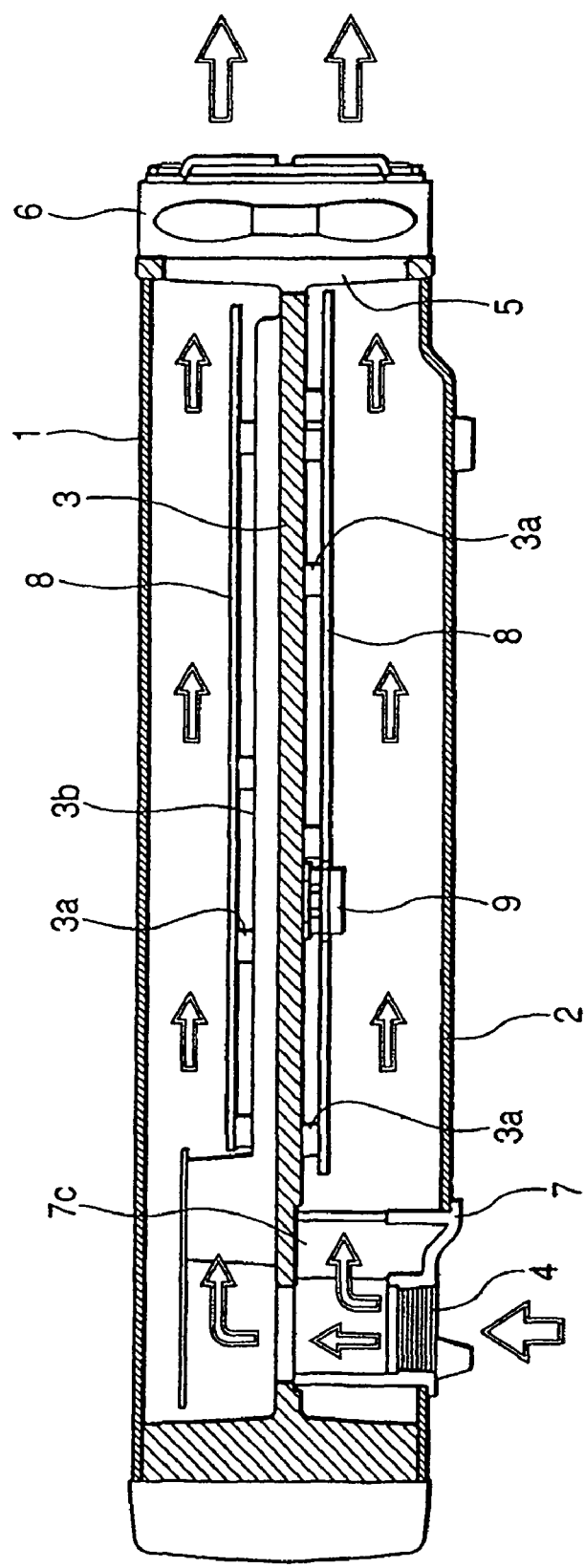
FIG. 1 is a cross-sectional view illustrating a device for air-cooling an electronic apparatus according to an embodiment of the present invention.
Figure 4:
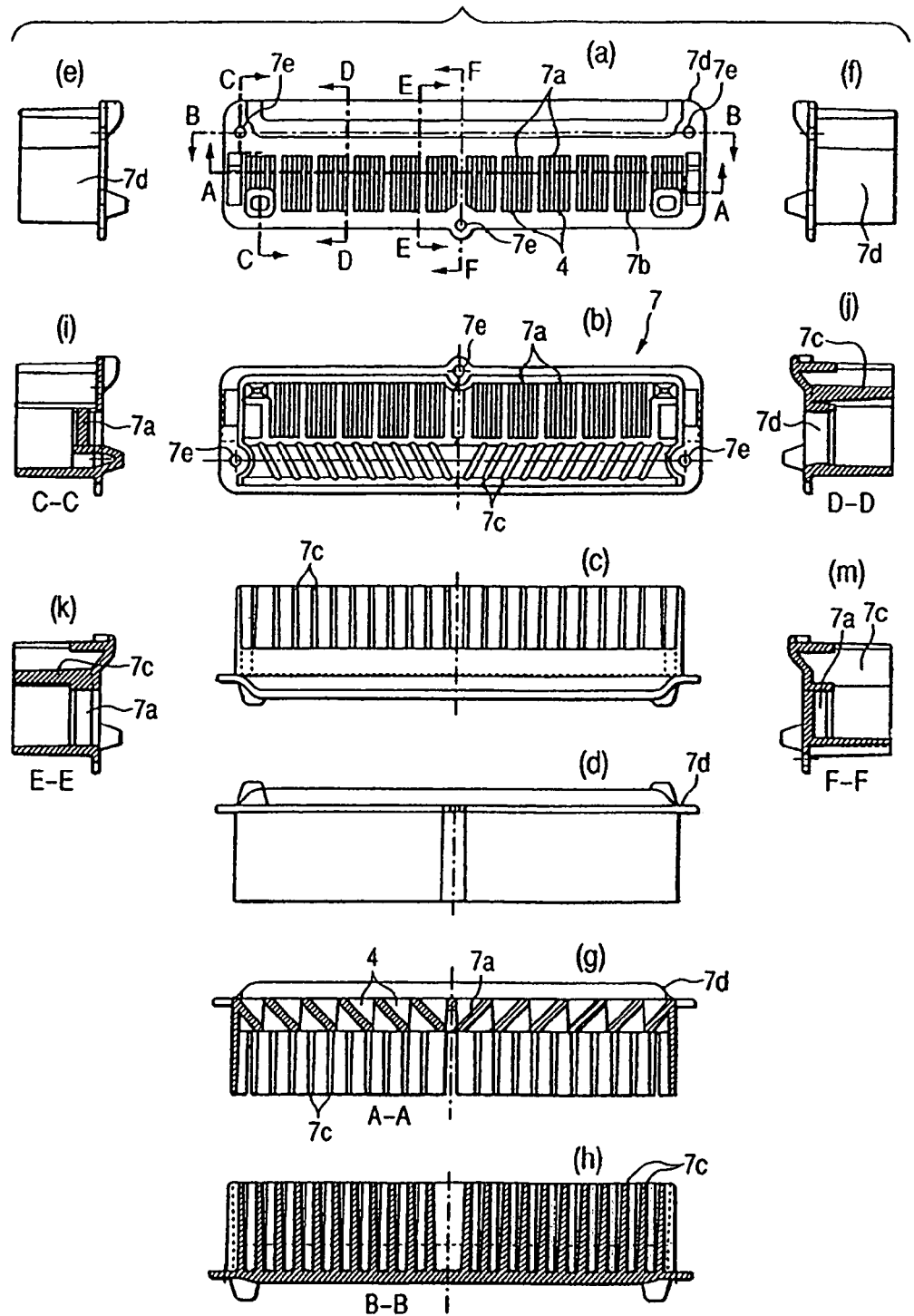
FIG. 4(a) is a front view illustrating a dust removing unit used in the air-cooling device.
FIG. 4(b) is a back view illustrating the dust removing unit.
FIG. 4(c) is a top view illustrating the dust removing unit.
FIG. 4(d) is a bottom view illustrating the dust removing unit.
FIG. 4(e) is a left side view illustrating the dust removing unit.
FIG. 4(f) is a right side view illustrating the dust removing unit.
FIG. 4(g) is a sectional view along the line A-A of FIG. 4(a)
FIG. 4(h) is a sectional view along the line B-B of FIG. 4(a)
FIG. 4(i) is a sectional view along the line C-C of FIG. 4(a)
FIG. 4(j) is a sectional view along the line D-D of FIG. 4(a)
FIG. 4(k) is a sectional view along the line E-E of FIG. 4(a)
FIG. 4(m) is a sectional view along the line F-F of FIG. 4(a)
Figure 5:
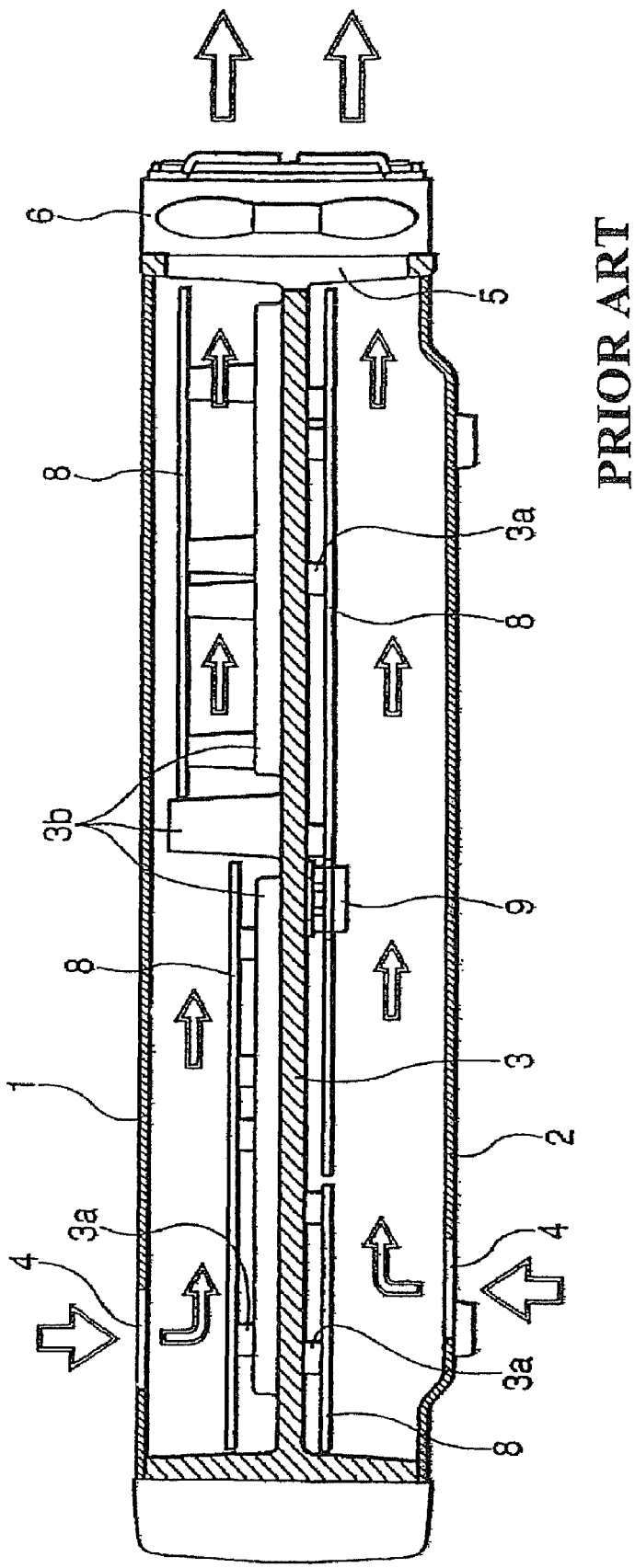
FIG. 5 is a cross-sectional view illustrating an exemplary conventional device for air-cooling an electronic apparatus.
Figure 6:
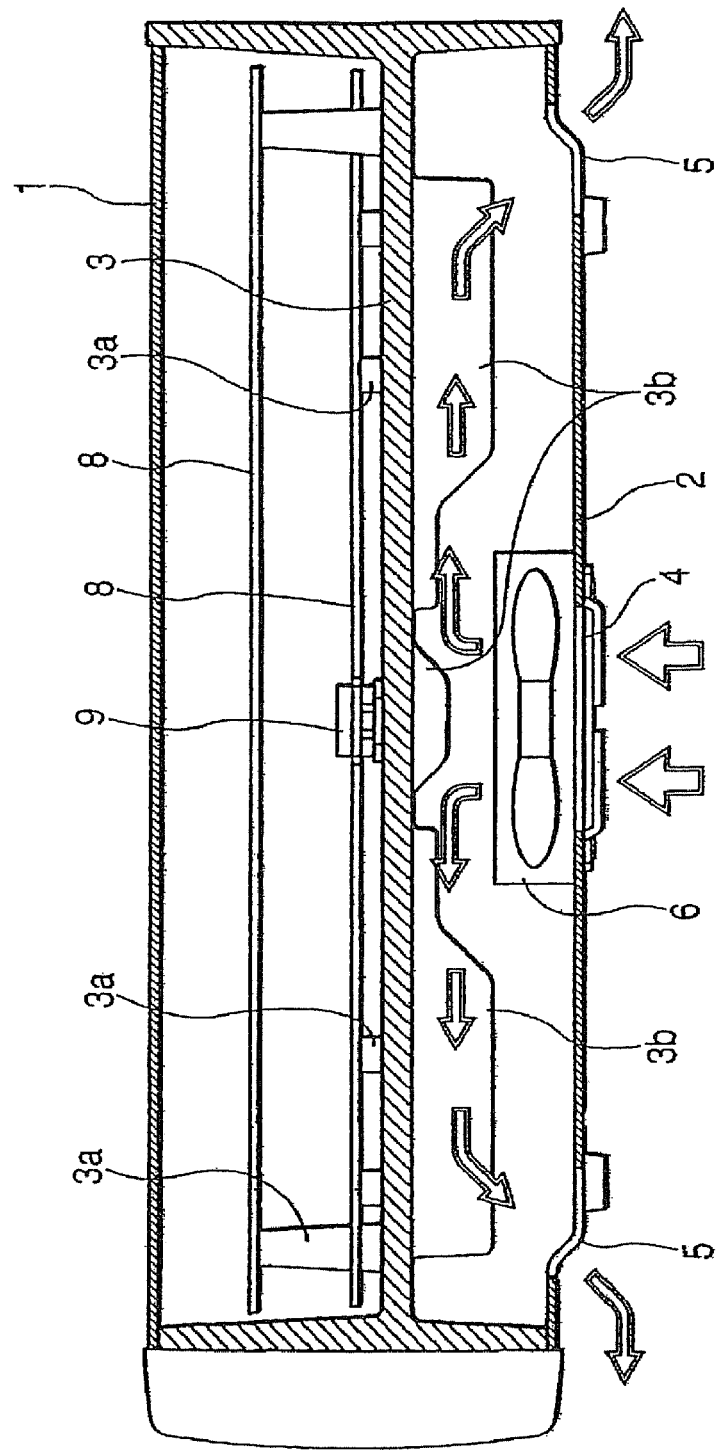
FIG. 6 is a cross-sectional view illustrating another exemplary conventional device for air-cooling an electronic apparatus.

A preferred embodiment to implement the present invention will be described below with reference to an embodiment. FIG. 1 is a cross-sectional view illustrating a device for air-cooling an electronic apparatus according to an embodiment of the present invention. An upper housing 1 and a lower housing 2 illustrated in FIG. 1 are coupled to sandwich a chassis 3 and constitutes a housing that contains an electronic apparatus. Suction openings 4, 4, ... which will be illustrated in detail in FIG. 4 are provided in a dustproof unit 7 attached so as to seal a hole of the lower housing 2; and a discharge opening 5 is provided in a chassis 3, or the upper housing 1 and the lower housing 2. Further, a fan 6 is secured to the chassis 3.

Bosses 3a, 3a, ... and radiation fin 3b are formed in the chassis 3; and printed boards 8, 8 are fastened to the bosses 3a, 3a, .... Heat produced by a maximum-heat-producing part 9 mounted on the printed boards 8 is transmitted via the heat transmitting parts to the chassis 3.

Airflow indicated by the arrow, traveling from the suction openings 4, 4, ... to the discharge opening 5 is generated by the fan 6. This airflow cools down the chassis 3 and heat-producing electronic parts including the maximum-heat-producing part 9 mounted on the printed boards 8, 8.

FIG. 4 illustrates the structure of the dustproof unit 7 in detail. The front view illustrated in FIG. 4(a) is a view of the dustproof unit 7 as seen from below in FIG. 1. That is, each of the figures of FIG. 4 is drawn with the lower face of the dustproof unit 7 being set as the front.

Twelve suction openings 4, 4, ... are, as illustrated in FIG. 4(a), formed in the front lower part of a frame 7d which constitutes the outer shape of the dustproof unit 7 of resin; and air introduction plates 7a, 7a are arranged at the back of the suction openings 4, 4, ... so as to be viewable from the suction openings 4, 4 ....

The air introduction plates 7a, 7a, ... are, as illustrated in FIG. 4(g), inclined relative to the front of the frame 7d. That is, the air introduction plates 7a, 7a, ... are inclined to change the direction of airflow entering via the suction openings 4, 4, .... The air introduction plate 7a is, as illustrated in detail in FIG. 3, provided with convexes 7b, 7b which extend in a direction (direction perpendicular to the paper plane) perpendicular to the airflow indicated by the arrow.

The downstream region (the right side part of FIG. 4(m)) of the air introduction plates 7a, 7a, ... is divided into a void part and a part in which the air lead-through boards 7c, 7c, ... are arranged. As illustrated in FIG. 1, an airflow passing the air lead-through boards 7c, 7c, ... travels along the lower space of the housing; an airflow bypassing the air lead-through boards 7c, 7c, ... travels along the upper space of the housing; and both of them are discharged via the discharge opening 5.

The frame 7d of the dustproof unit 7 is, as illustrated in FIGS. 4(a) and 4(b), provided with three mounting holes 7e, 7e, .... The dustproof unit 7 is fastened to the chassis 3 with screws (not illustrated) inserted into the mounting holes 7e, 7e, ....

Figure 3:
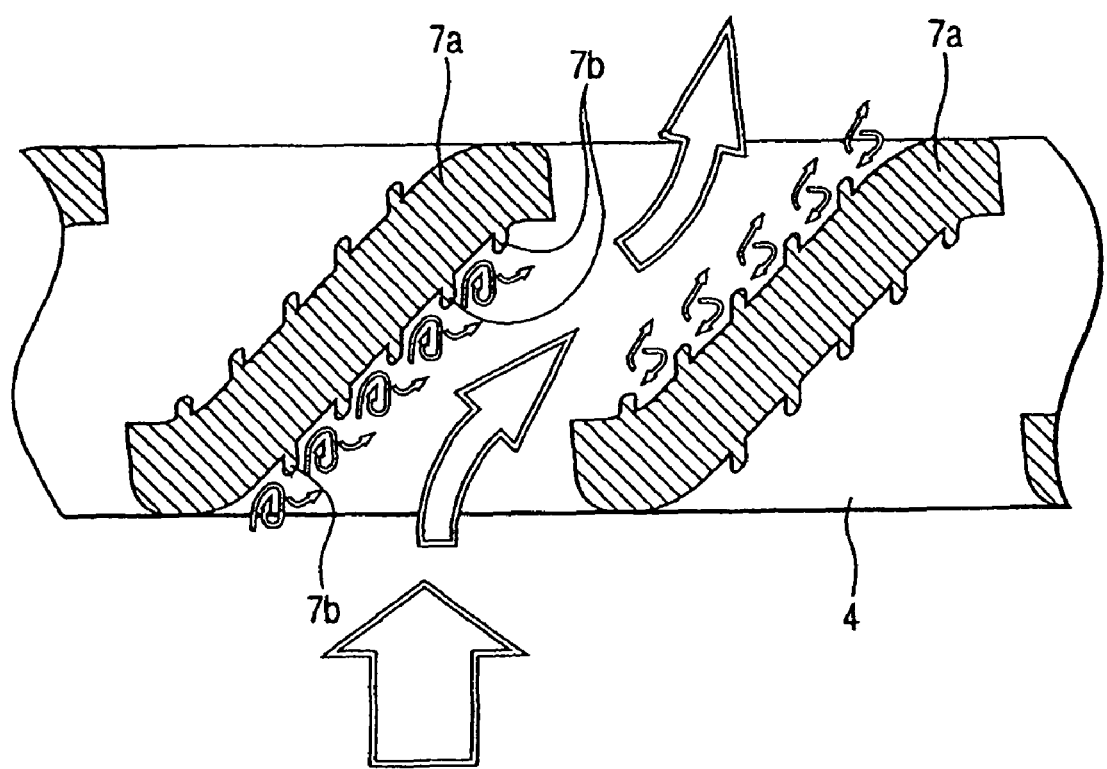
FIG. 3 is a side view illustrating a part of the air-cooling device.

In the above structure, a high-speed airflow entering via the suction opening 4 is, as indicated by the arrow in FIG. 3, bent to travel along the air introduction plate 7a. In this case, dust contained in the airflow is heavier than air, so the inertia causes the dust to collide with the convex 7b of the air introduction plate 7a. Also, the dust is thrown off from the airflow by a turbulent flow of the airflow produced in the vicinity of the convex 7b.

Figure 2:
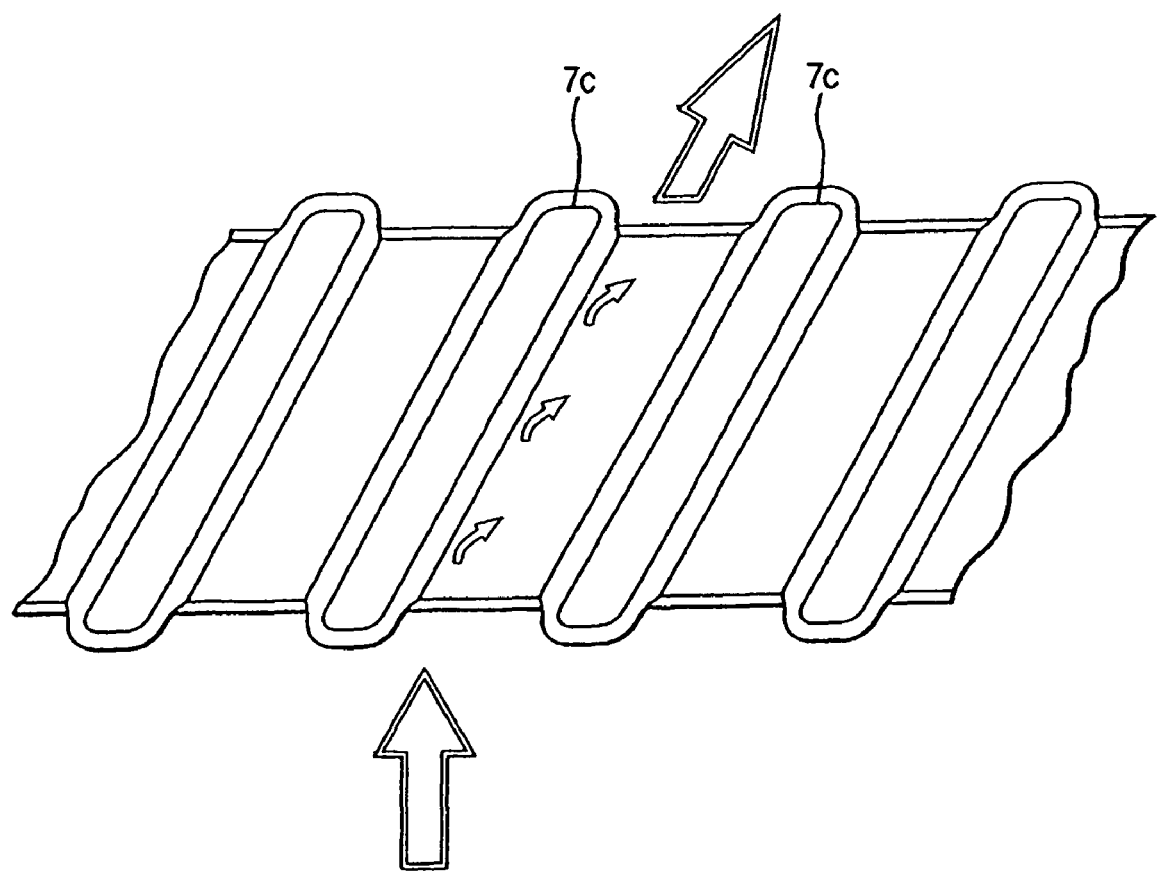
FIG. 2 is a side view illustrating a part of the air-cooling device.

After passing the air introduction plates 7a, the airflow passes the air lead-through boards 7c, 7c, .... In this case, also, the airflow is bent by the air lead-through boards 7c, 7c, ... as illustrated in FIG. 2, and thus the dust is further thrown off from the airflow.

Of the dust thrown off in this way, some go out of the housing, and others accumulate on the dustproof unit 7. The dustproof unit 7 can be easily detached by taking out the screws, and the dust can be removed by cleaning the dustproof unit 7, and thus the dust accumulating on the dustproof unit 7 is prevented from entering the airflow again.

In this way, since the airflow passing the inside of the housing does not pass through any filter, the flow rate of airflow is not limited by a filter, and thus the flow rate of airflow is large enough to obtain increased capacity for cooling. Further, dust is prevented from entering the housing, so parts in the housing is prevented from being short-circuited.

The present embodiment has the above structure, but the present invention is not limited thereto. For example, the effect of the present invention can be achieved even when the air lead-through board 7c is not provided; and when projections of a concave-like shape are arranged in the air lead-through board 7c, the effect of the present invention is further increased.

INDUSTRIAL APPLICABILITY

In the inventive air-cooling device for an electronic apparatus, a suction opening 4 is provided in a housing 1, a discharge opening 5 is provided in housings 1, 2, an airflow passing the inside of the housings is generated by a fan 5, and heat produced by a heat-producing body 9 is released to the outside of the housings by the airflow. Further, at least one air introduction plate inclined to change the direction of the airflow is arranged at the suction opening 4, and at least one projection is arranged on the surface of the air introduction plate. Accordingly, increased capacity for cooling a heat-producing part is obtained without increase in the size of the device, and accumulation of dust on the heat-producing part can be prevented.

The invention claimed is:

1. A device for air-cooling an electronic apparatus, comprising:
   a housing provided with a hole for suction air and a discharge opening for discharge air;
   a heat-producing body provided in the housing;
   a fan for generating an airflow from the hole to the discharge opening, heat produced by the heat-producing body being released to an outside of the housing by the airflow; and
   a dustproof unit sealing the hole and including a plurality of air introduction plates, a plurality of projections being formed on surfaces of the air introduction plates,
   wherein a suction opening to receive airflow is formed between edges of adjacent air introduction plates,
   wherein the air introduction plates are inclined to change a direction of the airflow entering via the suction opening,
   wherein the fan is arranged downstream of the airflow relative to the air introduction plates,
   wherein the projections formed on the surfaces of the air introduction plates on a side of the suction opening are extended in a direction of the suction opening, and
   wherein the projections formed on the surfaces of the air introduction plates on an opposite side of the suction opening are extended in an opposite direction of the suction opening.

2. The device for air-cooling an electronic apparatus according to claim 1, wherein a plurality of air lead-through boards inclined in a direction different from the air introduction plates is arranged at a downstream region of the air introduction plates.

3. The device for air-cooling an electronic apparatus according to claim 1,
   wherein at least one portion of the air introduction plates is arranged in a same direction and inclined at a prescribed angle.

4. The device for air-cooling an electronic apparatus according to claim 1,
   wherein the air introduction plates are constituted of resin in an integrated manner.

5. The device for air-cooling an electronic apparatus according to claim 1, further comprising a chassis for transmitting the heat produced by the heat-producing body, the chassis being arranged in the housing to divide a space of the housing,
   wherein the airflow travels along each of the divided spaces and is discharged via the discharge opening.

6. The device for air-cooling an electronic apparatus according to claim 1, further comprising a first portion of the air introduction plates inclined at a first angle and a second portion of the air introduction plates inclined at a second angle,
   wherein the first angle and the second angle have line symmetry with each other centering on a line parallel to a line between an endpoint of a first air introduction plate on the side of the suction opening and an endpoint of a second air introduction plate adjacent to the first air introduction plate on the opposite side of the suction opening.

7. The device for air-cooling an electronic apparatus according to claim 1,
   wherein a line between an endpoint of a first air introduction plate on the side of the suction opening and an endpoint of a second air introduction plate adjacent to the first air introduction plate on the opposite side of the suction opening is perpendicular to a line between the endpoint of the first air introduction plate on the side of the suction opening and an endpoint of the second air introduction plate on the side of the suction opening.

8. The device for air-cooling an electronic apparatus according to claim 1,
   wherein plural suction openings are aligned in parallel between adjacent air introduction plates.

9. A device for air-cooling an electronic apparatus, comprising:
   a housing provided with a hole for suction air and a discharge opening for discharge air;
   a heat-producing body provided in the housing;
   a fan for generating an airflow from the hole to the discharge opening, heat produced by the heat-producing body being released to an outside of the housing by the airflow, and
   a dustproof unit sealing the hole and including a plurality of air introduction plates, a plurality of projections being formed on surfaces of the air introduction plates,
   wherein suction openings to receive airflow are formed in parallel between edges of adjacent air introduction plates,
   wherein the air introduction plates are inclined to change a direction of the airflow entering via the suction openings, and
   wherein the fan is arranged downstream of the airflow relative to the air introduction plates.

10. The device for air-cooling an electronic apparatus according to claim 9, wherein a plurality of air lead-through boards inclined in a direction different from the air introduction plates are arranged at a downstream region of the air introduction plates.

11. The device for air-cooling an electronic apparatus according to claim 9,
    wherein at least one portion of the air introduction plates is arranged in a same direction and inclined at a prescribed angle.

12. The device for air-cooling an electronic apparatus according to claim 9,
    wherein the air introduction plates are constituted of resin in an integrated manner.

13. The device for air-cooling an electronic apparatus according to claim 9,
    wherein the projections formed on the surfaces of the air introduction plates on a side of the suction openings are extended in a direction of the suction openings; and
    wherein the projections formed on the surfaces of the air introduction plates on an opposite side of the suction openings are extended in an opposite direction of the suction openings.

14. The device for air-cooling an electronic apparatus according to claim 9, further comprising a chassis for transmitting the heat produced by the heat-producing body, the chassis being arranged in the housing to divide a space of the housing,
    wherein the airflow travels along each of the divided spaces and is discharged via the discharge opening.

15. The device for air-cooling an electronic apparatus according to claim 9, further comprising a first portion of the air introduction plates inclined at a first angle and a second portion of the air introduction plates inclined at a second angle,
    wherein the first angle and the second angle have line symmetry with each other centering on a line parallel to a line between an endpoint of a first air introduction plate on a side of the suction openings and an endpoint of a second air introduction plate adjacent to the first air introduction plate on an opposite side of the suction openings.

16. The device for air-cooling an electronic apparatus according to claim 9,
wherein a line between an endpoint of a first air introduction plate on a side of the suction openings and an endpoint of a second air introduction plate adjacent to the first air introduction plate on an opposite side of the suction openings is perpendicular to a line between the endpoint of the first air introduction plate on the side of the suction openings and an endpoint of the second air introduction plate on the side of the suction openings.

* * * * *